(12) United States Patent
Mayerhofer et al.

(10) Patent No.: US 10,431,708 B2
(45) Date of Patent: *Oct. 1, 2019

(54) INTEGRATED CIRCUIT INCLUDING ESD DEVICE AND RADIATION EMITTING DEVICE

(71) Applicant: Infineon Technologies AG, Neubiberg (DE)

(72) Inventors: Michael Mayerhofer, Deisenhofen (DE); Joost Willemen, Munich (DE); David Johnsson, Munich (DE)

(73) Assignee: Infineon Technologies AG, Neubiberg (DE)

( * ) Notice: Subject to any disclaimer, the term of this patent is extended or adjusted under 35 U.S.C. 154(b) by 610 days.

This patent is subject to a terminal disclaimer.

(21) Appl. No.: 14/860,918

(22) Filed: Sep. 22, 2015

(65) Prior Publication Data

US 2016/0013354 A1    Jan. 14, 2016

Related U.S. Application Data

(63) Continuation of application No. 12/421,313, filed on Apr. 9, 2009, now Pat. No. 9,142,592.

(51) Int. Cl.
| | | |
|---|---|---|
| *H01L 23/60* | (2006.01) |
| *H01L 27/02* | (2006.01) |
| *H01L 29/866* | (2006.01) |
| *H01L 23/62* | (2006.01) |
| *H01L 31/173* | (2006.01) |
| *H01L 27/15* | (2006.01) |
| *H01L 29/06* | (2006.01) |
| *H01L 29/861* | (2006.01) |
| *H01L 33/18* | (2010.01) |
| *H01L 33/34* | (2010.01) |
| *H02H 9/04* | (2006.01) |

(52) U.S. Cl.
CPC ............ *H01L 31/173* (2013.01); *H01L 23/60* (2013.01); *H01L 27/0248* (2013.01); *H01L 27/15* (2013.01); *H01L 29/0646* (2013.01); *H01L 29/861* (2013.01); *H01L 29/866* (2013.01); *H01L 33/18* (2013.01); *H01L 33/34* (2013.01); *H02H 9/04* (2013.01); *H01L 2924/0002* (2013.01); *H01L 2924/12044* (2013.01)

(58) Field of Classification Search
CPC combination set(s) only.
See application file for complete search history.

(56) References Cited

U.S. PATENT DOCUMENTS

| | | |
|---|---|---|
| 4,218,627 A | 8/1980 | Kiesel |
| 4,745,610 A | 5/1988 | Yoshikawa |
| 5,438,210 A | 8/1995 | Worley |
| 5,536,958 A | 7/1996 | Shen et al. |
| 6,472,688 B2 | 10/2002 | Miyata |

(Continued)

FOREIGN PATENT DOCUMENTS

CN            1652346         8/2005

*Primary Examiner* — Nduka E Ojeh
(74) *Attorney, Agent, or Firm* — Dicke, Billig & Czaja, PLLC

(57) ABSTRACT

An integrated circuit including ESD device is disclosed. One embodiment includes a semiconductor region being electrically isolated from adjacent semiconductor regions by an isolating region. Both an ESD device and a device configured to emit radiation are formed within the semiconductor region.

21 Claims, 6 Drawing Sheets

(56) References Cited

U.S. PATENT DOCUMENTS

| | | |
|---|---|---|
| 6,812,498 B1 | 11/2004 | Moon |
| 6,861,677 B2 | 3/2005 | Chen |
| 6,953,980 B2 | 10/2005 | Escoffier et al. |
| 7,173,311 B2 | 2/2007 | Sato et al. |
| 7,531,843 B2 | 5/2009 | Lin et al. |
| 7,715,162 B2 | 5/2010 | Krutsick |
| 2004/0046242 A1 | 3/2004 | Asakawa |
| 2004/0151219 A1 | 8/2004 | Numano |
| 2004/0214357 A1* | 10/2004 | Bosnyak ............... H01L 23/544 438/14 |
| 2005/0156186 A1 | 7/2005 | Lin et al. |
| 2005/0168899 A1 | 8/2005 | Sato et al. |
| 2005/0179042 A1 | 8/2005 | Yang et al. |
| 2006/0181828 A1 | 8/2006 | Sato et al. |
| 2007/0210317 A1 | 9/2007 | Chou et al. |
| 2009/0079022 A1 | 3/2009 | Keena et al. |
| 2009/0230476 A1 | 9/2009 | Krutsick |
| 2009/0283848 A1* | 11/2009 | Tan .................... H01L 27/0248 257/438 |
| 2010/0190298 A1 | 7/2010 | Kuramoto et al. |
| 2014/0070367 A1* | 3/2014 | Kawase ............. H01L 27/0255 257/532 |
| 2016/0093605 A1* | 3/2016 | Sai .................... H01L 27/0255 257/491 |

* cited by examiner

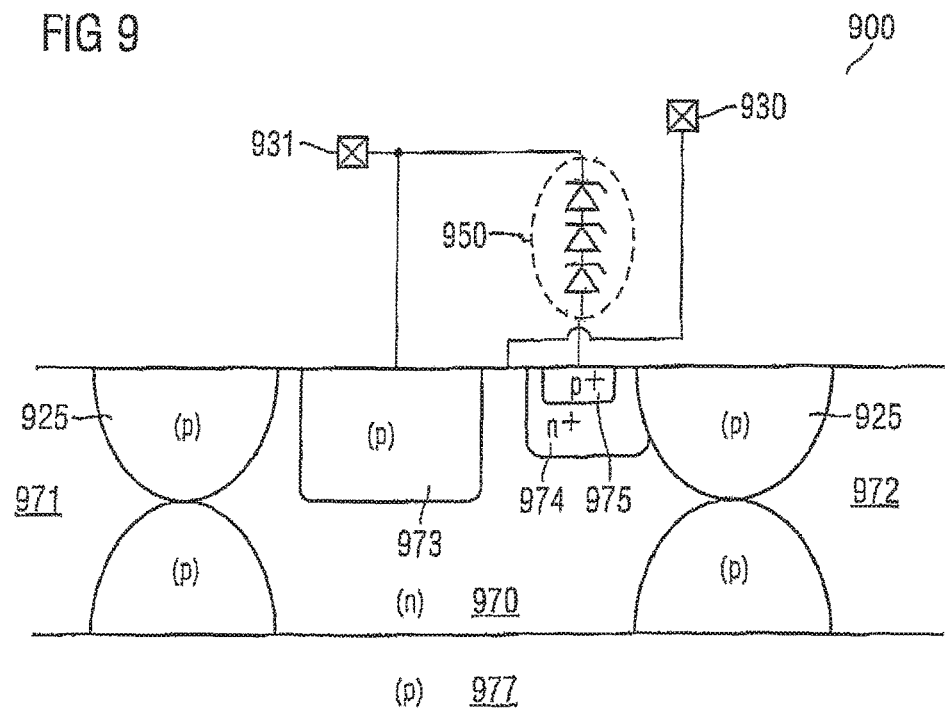
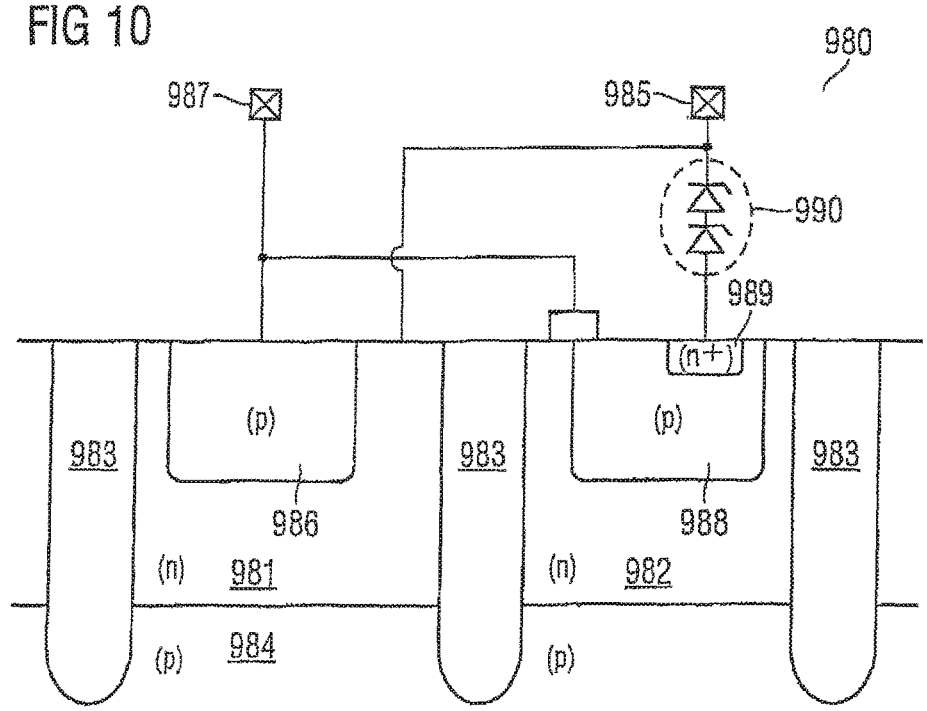

US 10,431,708 B2

INTEGRATED CIRCUIT INCLUDING ESD DEVICE AND RADIATION EMITTING DEVICE

CROSS-REFERENCE TO RELATED APPLICATIONS

This Utility Patent Application is a continuation application of U.S. application Ser. No. 12/421,313, filed Apr. 9, 2009, which is incorporated herein by reference.

BACKGROUND

Electrostatic discharge (ESD) devices are widespread in semiconductor technologies to protect circuit blocks from electrostatic discharge during assembly or operation, for example. These ESD devices require a fast and reliable current consumption to take over any discharge current before damage of circuit blocks.

A need exists for an integrated circuit including an ESD device having an improved fast and reliable onset of avalanche breakdown.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 9 illustrates a schematic cross-sectional view of an integrated circuit including both an ESD device and a device configured to emit radiation within a single junction-isolated n-type semiconductor well according to one embodiment.

FIG. 10 illustrates a schematic cross-sectional view of an integrated circuit including both an ESD device and a device configured to emit radiation within adjacent trench-isolated n-type semiconductor wells according to one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides an integrated circuit including a semiconductor region being electrically isolated from adjacent semiconductor regions by an isolating region. In the integrated circuit, both an ESD device and a device configured to emit radiation are formed within the semiconductor region.

According to one embodiment of a method of manufacturing an integrated circuit, a semiconductor region is formed. The semiconductor region is electrically isolated from adjacent semiconductor regions by an isolating region. An ESD device and a device configured to emit radiation are formed within the semiconductor region.

Figure 1:
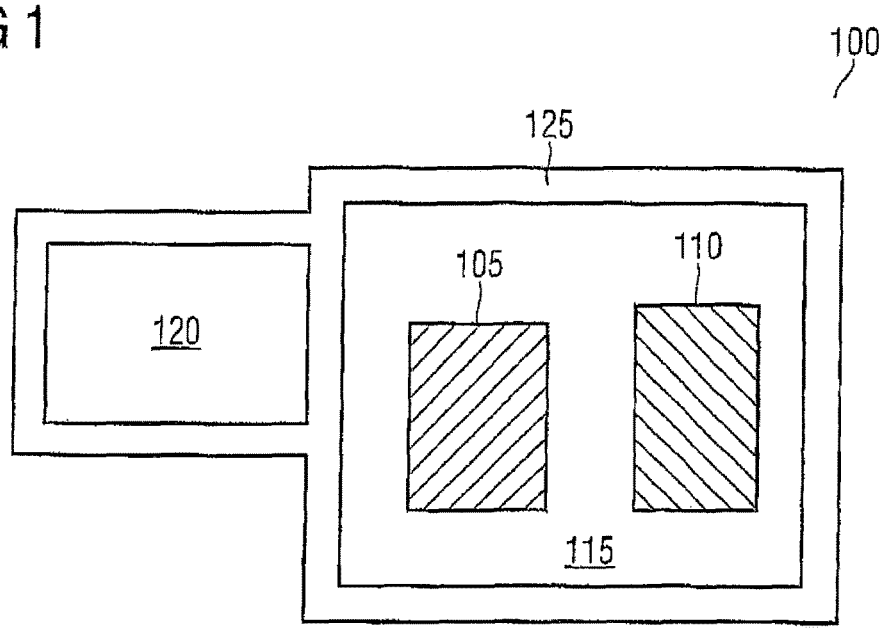
FIG. 1 illustrates a schematic plan view of one embodiment of an integrated circuit including both an ESD device and a device configured to emit radiation within a semiconductor region electrically isolated from adjacent semiconductor regions by an isolating region.

FIG. 1 illustrates a schematic plan view of a substrate portion of an integrated circuit 100 including both an ESD device 105 and a device configured to emit radiation 110 within a semiconductor region 115. The semiconductor region 115 is electrically isolated from adjacent semiconductor regions such as adjacent semiconductor region 120 by an isolating region 125. The semiconductor region 115 may be a continuous semiconductor region.

An operation voltage of ESD device 105 as well as the onset of ESD current consumption may be determined by avalanche breakdown of a pn-junction of the ESD device 105. By way of example, the ESD device 105 may be a diode or a parasitic diode of a bipolar transistor, a parasitic diode of MOS device, e.g., a body-drain diode, or a thyristor such as a silicon controlled rectifier (SCR).

The device configured to emit radiation 110 may be any device emitting radiation capable to generate electron-hole pairs within ESD device 105 by photon absorption. The electron-hole pairs generated within the ESD device 105 may trigger avalanche breakdown within this device. By way of example, the device 110 may be a forward-biased diode, a reverse-biased diode, e.g., a zener diode, a MOS device in hot carrier injection operation conditions, a MOS device accelerating electrical carriers in a high electrical field of a drain extension region, a modified silicon pn-junction with enhanced optical emission properties such as a lithium-doped pn-junction, a porous silicon junction, or an amorphous Si—SiN junction. The device 110 may be connected in series to a trigger circuit which may be a passive, e.g., differentiating, RC network or a circuit-containing active electronic component.

The device configured to emit radiation 110 may be a radiation-emitting device that does not suffer from a delay in avalanche generation. By way of example, emission of radiation of device 110 may be effected by an operation condition different from avalanche generation such as radiative recombination in a forward-biased diode or may be effected by avalanche generation initiating faster than avalanche generation within ESD device 105. A series connection of the device 110 and at least one further circuit element may be connected in parallel to ESD device 105. The at least one further circuit element may be an array of zener diodes, e.g., for voltage-matching, a current limiting resistor, or an active electronic circuitry, for example.

At least one semiconductor zone may be an integral part of both the ESD device 105 and the device configured to emit radiation 110, the at least one semiconductor zone being electrically connected at a surface side thereof (not illustrated in FIG. 1). By way of example, the at least one semiconductor zone may be an outermost semiconductor well of the semiconductor region 115 such as an outer n-type semiconductor well or an outer p-type semiconductor well. The term "outermost" designates the semiconductor well adjoining to an isolation region such as a dielectric trench isolation or junction isolation. According to another embodiment, the at least one semiconductor zone may be embedded in a semiconductor zone of the semiconductor region 115.

The isolating region 125 may be a junction-isolating region or a trench isolating region, e.g., a trench filled with dielectric material such as $SiO_2$, for example. Apart from laterally adjoining to isolating region 125, the semiconductor region 115 may adjoin to a further semiconductor region of opposite conductivity type or to a dielectric region in a vertical direction into the substrate, i.e., in a direction perpendicular to the drawing plane of FIG. 1. By way of example, the semiconductor region 115 and a dielectric region below the semiconductor region 115 may be part of a silicon-on-insulator (SOI) substrate.

Examples given with regard to elements disclosed in FIG. 1 may apply likewise to corresponding elements described in further embodiments below.

Figure 2:
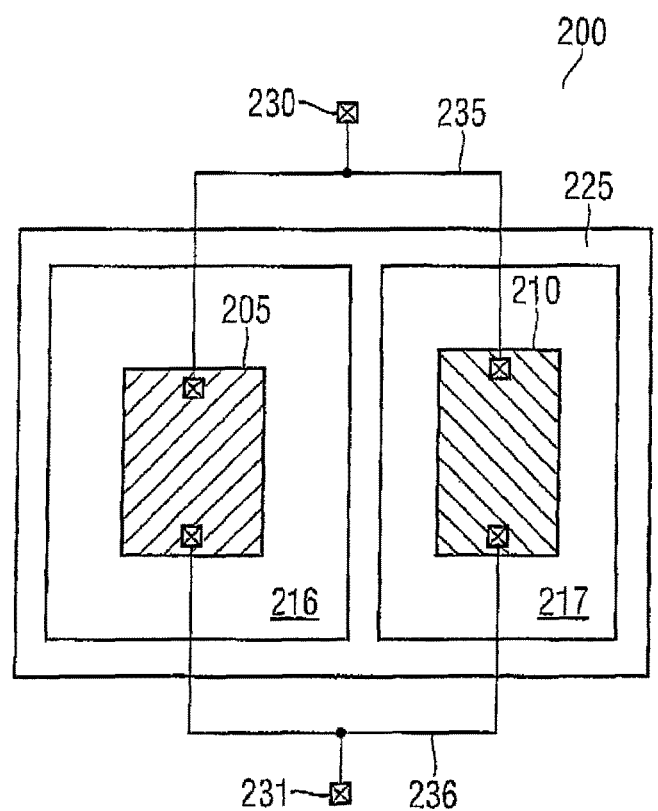
FIG. 2 illustrates one embodiment of an integrated circuit including an ESD device and a device configured to emit radiation formed in adjacent semiconductor regions, the ESD device and the device configured to emit radiation being electrically coupled to a same pair of circuit pins.

FIG. 2 illustrates a schematic plan view of a substrate portion of an integrated circuit 200 including an ESD device 205 and a device configured to emit radiation 210, the ESD device 205 and the device 210 being formed in adjacent semiconductor regions 216, 217. Semiconductor regions 216, 217 are electrically isolated by an isolating region 225.

The ESD device 205 and the device configured to emit radiation 210 are electrically coupled to a same pair of circuit pins 230, 231 via conductive lines 235, 236. At least one further circuit element may be connected in series with device 210, e.g., between circuit pin 230 and device 210 or between circuit pin 231 and device 210 (not illustrated in FIG. 2). The term "electrically coupled" used herein implies both a direct electric connection between the elements that are electrically coupled, e.g., coupled by a metal line, and an electric connection including intervening circuit elements.

Figure 3:
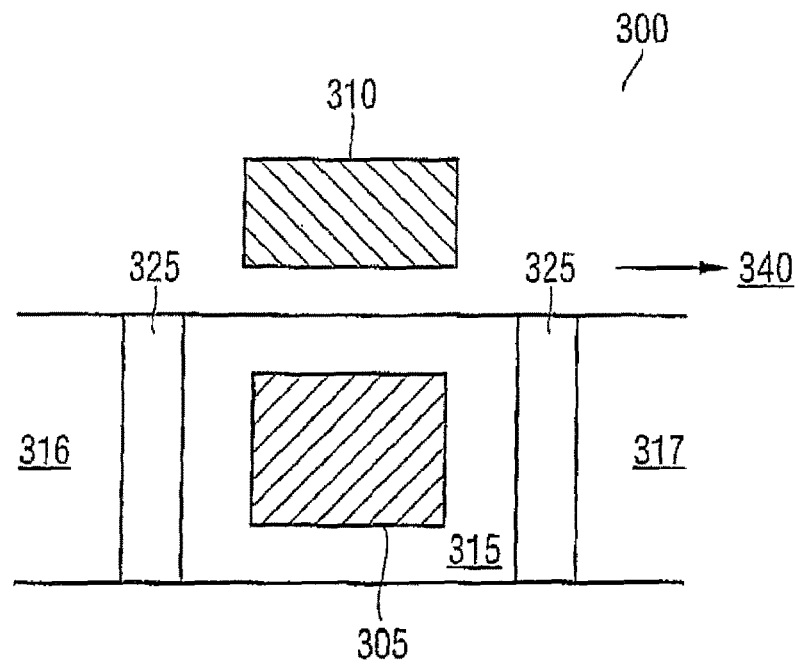
FIG. 3 illustrates a schematic cross-sectional view of one embodiment of an integrated circuit including an ESD device formed in a semiconductor region and a device configured to emit radiation arranged above the ESD device.

FIG. 3 illustrates a schematic cross-sectional view of a substrate portion of an integrated circuit 300 including an ESD device 305 formed within a semiconductor region 315 and a device configured to emit radiation 310 arranged above the ESD device 305. Semiconductor region 315 is electrically isolated from adjacent semiconductor regions 316, 317 by an isolating region 325.

In one embodiment illustrated in FIG. 3, dimensions of the device 310 along a lateral direction 340 do not extend beyond the ends of the semiconductor region 315, i.e., device 310 fully overlaps with regard to a surface area of semiconductor region 315. According to one embodiment (not illustrated in FIG. 3), dimensions of device 310 along the lateral direction 340 may only partly overlap with regard to the surface area of the semiconductor region 315, i.e., device 310 may partly overlap with regard to any of surface areas of isolation regions 325, semiconductor regions 316, 317.

According to one embodiment (not illustrated in FIG. 3), dimensions of device 310 along the lateral direction 340 may not overlap with regard to the surface area of the semiconductor region 315 provided that the arrangement allows for optical coupling between device 310 and ESD device 305, i.e., photons emitted from device 310 may be absorbed by ESD device 305. All of these embodiments have in common that device 310 is optically coupled to ESD device 305 via a surface area of the semiconductor substrate including semiconductor regions 315, 316, 317.

The device configured to emit radiation 310 may be formed within a wiring area above the semiconductor substrate including semiconductor region 315. The term wiring area refers to an area above an active area within the semiconductor substrate such as semiconductor region 315, the wiring area including one or a plurality of conductive layers such as metal layers electrically connected to active areas within the semiconductor substrate by conductive material such as contact plugs, for example. By way of example, device 310 may be formed as a pn-junction diode made of polysilicon within the wiring area. According to one embodiment, device 310 may be formed within a semiconductor substrate other than the semiconductor substrate including the ESD device 305. By way of example, device 310 may be a light-emitting diode (LED) such as a LED formed of III-V semiconductor compound materials or it may be an organic LED arranged above the semiconductor substrate including semiconductor region 315 by chip-on-chip bonding, for example.

Figure 4:
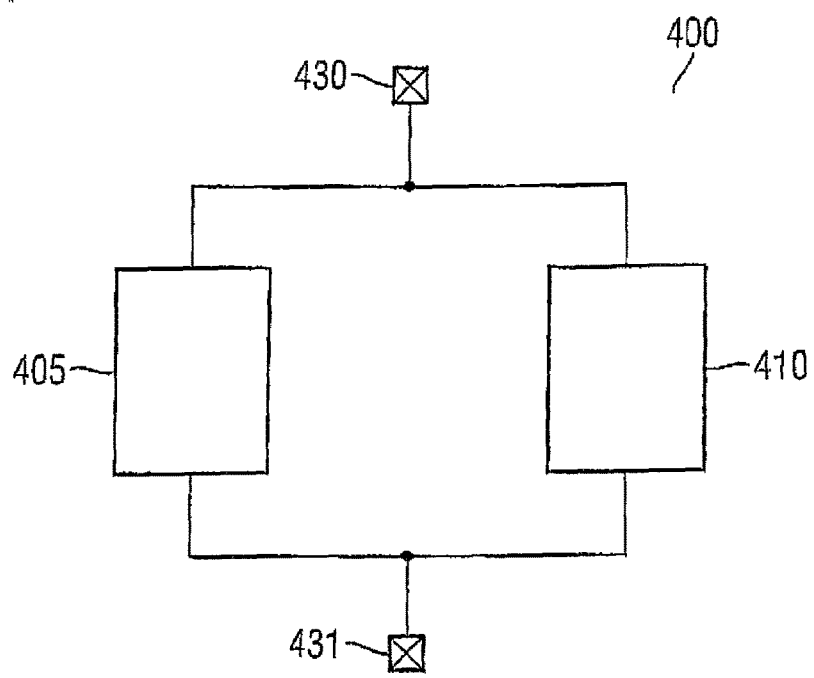
FIG. 4 illustrates an equivalent circuit of an ESD device and a device configured to emit radiation of an integrated circuit according to one embodiment.

FIG. 4 illustrates an equivalent circuit part of an integrated circuit 400 including an ESD device 405 and a device configured to emit radiation 410 according to one embodiment. The arrangement of the ESD device 405 relative to the device configured to emit radiation 410 may be as described in any of the above embodiments partly illustrated in any of FIGS. 1 to 3. Both the ESD device 405 and the device configured to emit radiation 410 are electrically coupled to a same pair of circuit pins 430, 431. In one embodiment illustrated in FIG. 4, both the ESD device 405 and the device configured to emit radiation 410 are directly coupled to circuit pins 430, 431. According to one or more embodiments, further circuit elements may be connected in series to device 410, i.e., further circuit elements may be electrically coupled between circuit pin 430 and device 410 or between circuit pin 431 and device 410. The device configured to emit radiation 410 may also be connected to a power supply pin (not illustrated in FIG. 4). Thereby, emission of radiation from device 410 under active operation of integrated circuit 400 and thus a response characteristic of ESD device 405 under active operation of integrated circuit 400 may be improved.

Figure 5:
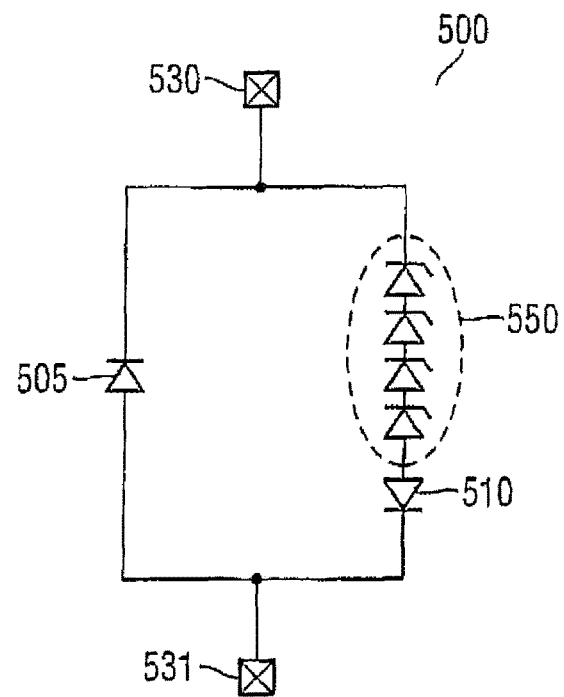
FIG. 5 illustrates an equivalent circuit part of an integrated circuit including a pn-junction ESD diode, a zener diode array for voltage-matching and a radiation-emitting forward-biased pn-junction diode according to one embodiment.

FIG. 5 illustrates an equivalent circuit part of an integrated circuit 500 including a pn-junction ESD diode 505, a zener diode array 550 for voltage-matching and a radiation-emitting forward-biased diode, e.g., a silicon diode 510. An anode of ESD diode 505 and a cathode of radiation-emitting diode 510 are electrically coupled to circuit pin 531, e.g., a ground (GND) pin. The cathode of ESD diode 505 and the anode of radiation-emitting diode 510 are electrically coupled to circuit pin 530, e.g., an input/output (IN/OUT) pin or supply pin. At the beginning of ESD current flow into circuit pin 530, a voltage at circuit pin 530 may rise up to a clamping voltage of the zener diode array 550. The current then flowing through the zener diode array 550 via forward-biased diode 510 may lead to emission of radiation that is at least partly absorbed in ESD diode 505 triggering avalanche generation.

Figure 6:
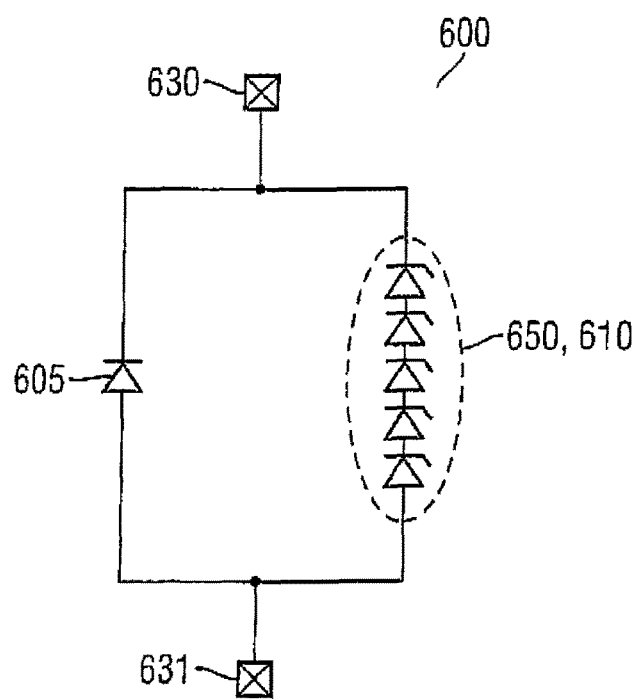
FIG. 6 illustrates an equivalent circuit part of an integrated circuit including a pn-junction ESD diode, a zener diode array for voltage-matching and a radiation-emitting reverse-biased pn-junction diode according to one embodiment.

FIG. 6 illustrates an equivalent circuit part of an integrated circuit 600 including an ESD diode 605 and a zener diode array 650 according to one embodiment. The zener diodes of zener diode array 650 may act as radiation-emitting reverse-biased diodes 610. The ESD diode 605 is connected in parallel to zener diode array 650, both the ESD diode 605 and the zener diode array 650 being electrically coupled to a same pair of circuit pins 630, 631. At the beginning of ESD current flow into circuit pin 630, radiation emitted from one or more zener diodes in array 650 may be absorbed in ESD diode 605 and generate electron-hole pairs triggering avalanche generation in this ESD diode similar to one embodiment illustrated in FIG. 5.

Figure 7:
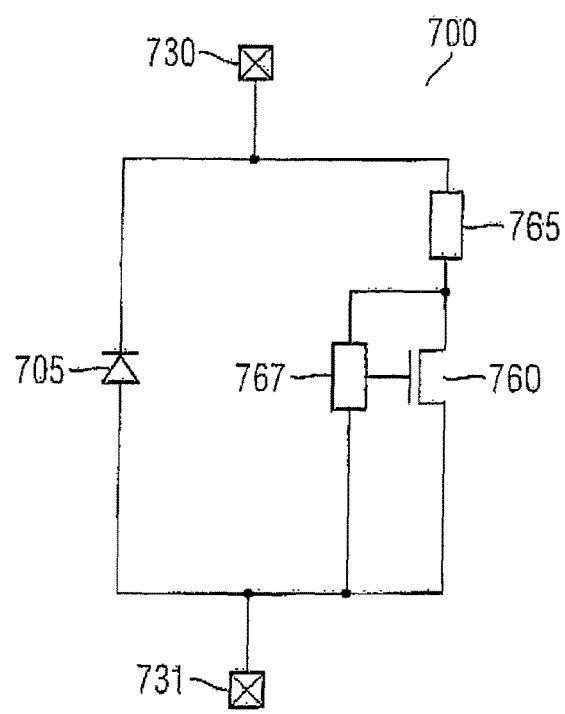
FIG. 7 illustrates an equivalent circuit part of an integrated circuit including a pn-junction ESD diode and a radiation emitting metal oxide semiconductor field effect transistor (MOSFET) with a voltage-matching circuit according to one embodiment.

FIG. 7 illustrates an equivalent circuit part of an integrated circuit 700 including an ESD diode 705 and a radiation emitting MOSFET 760 with a voltage matching circuit 765, e.g., a voltage divider, and a gate biasing circuit 767 according to an embodiment. MOSFET 760 is connected in parallel to the ESD diode 705. Both ESD diode 705 and MOSFET 760 are electrically coupled to a same pair of circuit pins 730, 731. Between circuit pin 730 and voltage matching circuit 765 as well as between circuit pin 731 and gate biasing circuit 767, further circuit devices may be placed. At the beginning of ESD current flow into circuit pin 730, a voltage at circuit pin 730 may rise and at a threshold voltage predetermined by voltage matching circuit 765 hot carrier injection in MOSFET 760 may start accompanied by emission of radiation. The radiation emitted from MOSFET 760 may at least partly be absorbed in ESD diode 705 triggering avalanche breakdown in this diode by the generated electron-hole pairs. Although the equivalent circuit part illustrated in FIG. 7 includes one MOSFET 760, a different number of MOSFETs may be chosen.

Figure 8:
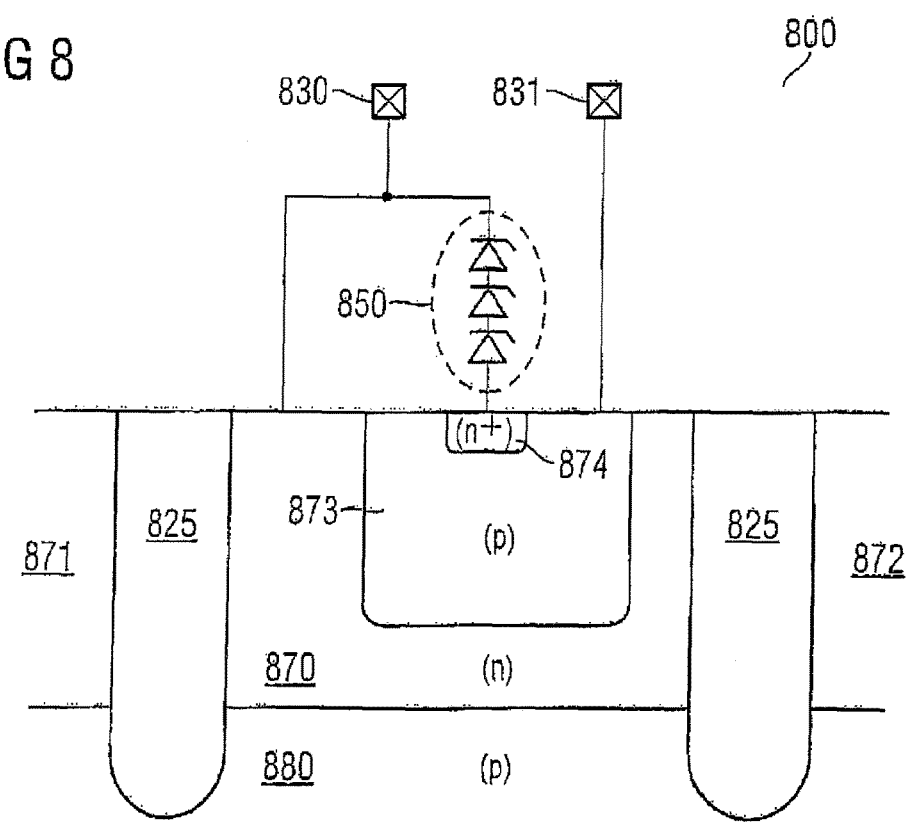
FIG. 8 illustrates a schematic cross-sectional view of one embodiment of an integrated circuit including both an ESD device and a device configured to emit radiation within a single trench-isolated n-type semiconductor well according to one embodiment.

FIG. 8 illustrates a schematic cross-sectional view of a substrate portion of an integrated circuit 800 including both an ESD diode and a radiation-emitting diode within a single n-type semiconductor well 870. The n-type semiconductor well 870 laterally adjoins to a trench-isolating region 825 and adjoins to a p-type semiconductor region 880 at a bottom side thereof. Therefore, n-type semiconductor well 870 is electrically isolated from adjacent semiconductor regions 871, 872 by a dielectric insulation constituted by the trench isolating regions 825 and by a junction isolation constituted by p-type semiconductor zone 880 and n-type semiconductor well 870. A p-type semiconductor well 873 is embedded within n-type semiconductor well 870. An $n^+$-type semiconductor well 874 is embedded within p-type semiconductor well 873.

The ESD diode is formed by n-type semiconductor well 870 as a cathode and p-type semiconductor well 873 as an anode. The device configured to emit radiation is formed by a diode constituted by p-type semiconductor well 873 as the anode and $n^+$-type semiconductor well 874 as the cathode. Therefore, both the ESD diode and the radiation-emitting diode share p-type semiconductor well 873 as an anode electrically coupled to a circuit pin 831. The cathode of the radiation-emitting diode formed of $n^+$-type semiconductor well 874 is electrically coupled to circuit pin 830 via zener diode array 850 for voltage matching. Apart from zener diodes, other circuit elements may be used for voltage matching throughout this document, e.g., a MOSFET with active clamping. The cathode of the ESD diode constituted by n-type semiconductor well 870 is electrically coupled to circuit pin 830.

At the beginning of ESD current flowing into circuit pin 830, the voltage at this pin 830 may rise up to a clamping voltage of zener diode array 850. A current flowing through zener diode array 850 and the reverse-biased diode constituted by $n^+$-type semiconductor well 874 and p-type semiconductor well 873 may lead to emission of radiation that is at least partly absorbed at the pn-junction of the ESD diode constituted by n-type semiconductor well region 870 and p-type semiconductor well region 873. The absorbed radiation may generate electron-hole pairs triggering avalanche breakdown in the ESD diode. Thus, a fast and reliable avalanche ignition in the ESD diode may be achieved.

FIG. 9 illustrates a schematic cross-sectional view of a substrate portion of an integrated circuit 900 including both an ESD device and a device configured to emit radiation within a single n-type semiconductor well 970 electrically isolated from adjacent semiconductor wells 971, 972 by junction isolation regions 925. The outer n-type semiconductor well 970 furthermore adjoins to a p-type semiconductor region 977 at a bottom side thereof.

The ESD device is formed as an ESD diode constituted by outer n-type semiconductor well 970 as a cathode and p-type semiconductor well 973 as an anode embedded in the n-type semiconductor well 970. The device configured to emit radiation is formed by $n^+$-type semiconductor well 974 embedded in outer n-type semiconductor well 970 as the cathode and $p^+$-type semiconductor well 975 as the anode embedded in $n^+$-type semiconductor well 974. The ESD diode and the device configured to emit radiation share outer n-type semiconductor well 970 as a common cathode. The anode 975 of the radiation-emitting device is electrically coupled to a circuit pin 931 via an array of zener diodes 950 for voltage-matching. The anode 973 of the ESD diode is electrically coupled to circuit pin 931. The operation principle at the beginning of ESD current flow into the circuit pin elucidated above with regard to one embodiment illustrated in FIG. 8 likewise applies to one embodiment illustrated in FIG. 9.

FIG. 10 illustrates a schematic cross-sectional view of a substrate portion of an integrated circuit 980 including an ESD device and a device configured to emit radiation. The ESD device and the device configured to emit radiation are formed within adjacent n-type semiconductor wells 981, 982 electrically isolated from adjacent semiconductor regions by trench isolation regions 983. Bottom sides of each of the n-type semiconductor wells 981, 982 adjoin to a p-type semiconductor region 984, e.g., a p-type semiconductor substrate.

The ESD device is formed as an ESD diode constituted by n-type semiconductor well 981 as a cathode electrically coupled to circuit pin 985 and p-type semiconductor well 986 as an anode embedded in n-type semiconductor well 981 and electrically coupled to circuit pin 987. The device configured to emit radiation is formed as a diode constituted by p-type semiconductor well 988 as an anode embedded in n-type semiconductor well 982 and n$^+$-type semiconductor well 989 as a cathode embedded in p-type semiconductor well 988. The anode 988 of the radiation-emitting device is electrically coupled to circuit pin 987 and the cathode 989 of the radiation-emitting device is electrically coupled to circuit pin 985 via zener diode array 990 for voltage-matching.

Similar to the embodiments illustrated in FIGS. 8 and 9, at the beginning of ESD current flowing into circuit pin 985 and through zener diode array 990 as well as through the diode formed of semiconductor wells 988, 989, radiation emitted from reverse-biased pn-junction diode 988, 989 may be absorbed at the pn-junction of the ESD diode constituted by n-type semiconductor well 981 and p-type semiconductor well 986 and trigger avalanche breakdown in the ESD device by the generated electron-hole pairs. Thus, a fast and reliable ignition of avalanche generation within the ESD device may be achieved. The voltage matching circuit elements, i.e., zener diode array 990, may be also placed between pin 987 and anode 988 or one part of the voltage matching circuit elements may be placed between pin 985 and cathode 989 and the other part may be placed between pin 987 and the anode 988.

Figure 11:
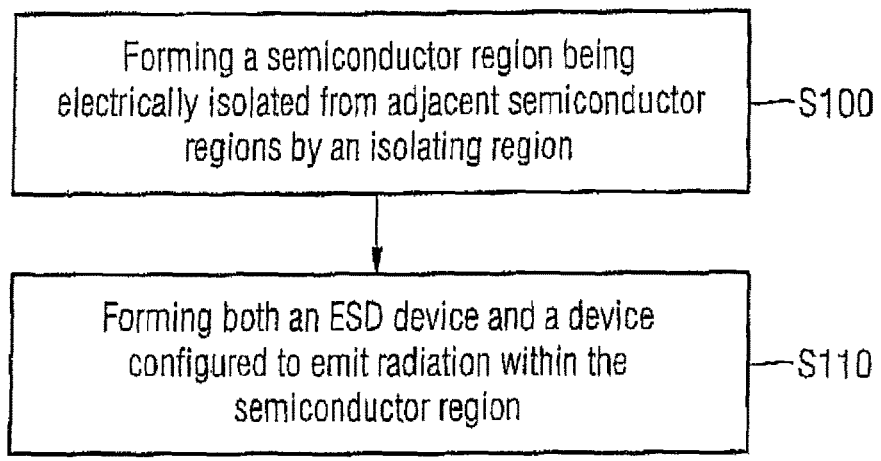
FIG. 11 is a simplified flow chart illustrating a method of manufacturing an integrated circuit including an ESD device and a radiation-emitting trigger device according to one embodiment.

FIG. 11 is a simplified flow chart of a method for manufacturing an integrated circuit. At S100, a semiconductor region is formed, the semiconductor region being electrically isolated by an isolating region. At S110, both an ESD device and a device configured to emit radiation are formed within the semiconductor region.

Figure 12:
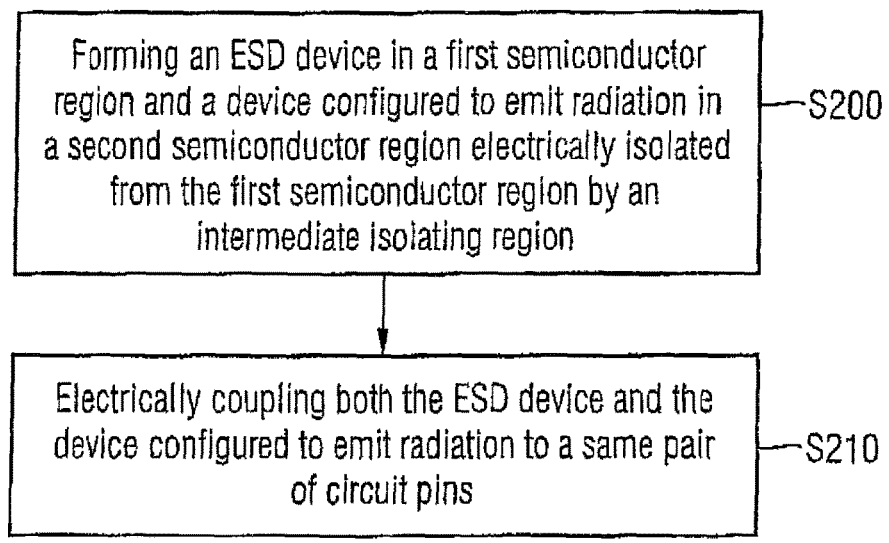
FIG. 12 is a simplified flow chart illustrating a method of manufacturing an integrated circuit including an ESD device and a radiation-emitting trigger device according to one embodiment.

FIG. 12 is a simplified flow chart of a method for manufacturing an integrated circuit according to one embodiment. At S200, an ESD device is formed in a first semiconductor region and a device configured to emit radiation is formed in a second semiconductor region. At S210, both the ESD device and the device configured to emit radiation are electrically coupled to a same pair of circuit pins.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
   an ESD device in a semiconductor substrate;
   a device in the semiconductor substrate that emits radiation upon electrostatic discharge current beginning to flow through a pin electrically coupled to the ESD device, the ESD device having a pn-junction connected in parallel with the device in the semiconductor substrate that emits radiation upon electrostatic discharge current beginning to flow through a pin electrically coupled to the ESD device, wherein upon occurrence of the electrostatic discharge the ESD device receives the emitted radiation to accelerate avalanche breakdown in the ESD device; and wherein
   the ESD device is configured to protect a circuit block different from the ESD device from damage that would otherwise be caused by electrostatic discharge.

2. The integrated circuit of claim 1, wherein a series connection of the device in the semiconductor substrate that emits radiation upon electrostatic discharge current beginning to flow through a pin electrically coupled to the ESD device and at least one further circuit element is connected in parallel to the ESD device.

3. The integrated circuit of claim 2, wherein the at least one further circuit element includes a Zener diode.

4. The integrated circuit of claim 1, wherein at least one semiconductor zone is an integral part of both the ESD device and the device in the semiconductor substrate that emits radiation upon electrostatic discharge current beginning to flow through a pin electrically coupled to the ESD device, the at least one semiconductor zone being electrically connected at a surface side thereof.

5. The integrated circuit of claim 4, wherein the at least one semiconductor zone is an outermost semiconductor well of a semiconductor region.

6. The integrated circuit of claim 4, wherein the at least one semiconductor zone is embedded in a further semiconductor zone of a semiconductor region.

7. The integrated circuit of claim 1, wherein the device in the semiconductor substrate that emits radiation upon electrostatic discharge current beginning to flow through a pin electrically coupled to the ESD device is a Zener diode, an anode of the Zener diode and an anode of the pn-junction of the ESD device being electrically coupled to a same circuit pin.

8. The integrated circuit of claim 1, wherein the device in the semiconductor substrate that emits radiation upon electrostatic discharge current beginning to flow through a pin electrically coupled to the ESD device is a diode, a cathode of the diode and an anode of the pn-junction of the ESD device being electrically coupled to a same circuit pin.

9. The integrated circuit of claim 1, wherein the device in the semiconductor substrate that emits radiation upon electrostatic discharge current beginning to flow through a pin electrically coupled to the ESD device is electrically coupled to a power supply pin.

10. The integrated circuit of claim 1, wherein the device in the semiconductor substrate that emits radiation upon electrostatic discharge current beginning to flow through a pin electrically coupled to the ESD device and the ESD device are formed within a semiconductor region electrically isolated from adjacent semiconductor regions by an isolating region.

11. The integrated circuit of claim 10, wherein the isolating region is a pn-junction isolation.

12. The integrated circuit of claim 1, wherein the device in the semiconductor substrate that emits radiation upon electrostatic discharge current beginning to flow through a pin electrically coupled to the ESD device is formed in a first semiconductor region, the ESD device is formed in a second semiconductor region, and the first semiconductor region is electrically isolated from the second semiconductor region by an intermediate isolating region.

13. The integrated circuit of claim 12, wherein the intermediate isolating region is a pn-junction isolation.

14. An integrated circuit, comprising:
an ESD device formed in a semiconductor region of a semiconductor substrate, the ESD device having a pn-junction; and
a device configured to emit radiation arranged above the ESD device, the pn-junction of the ESD device connected in parallel with the device configured to emit radiation, the ESD device and the device configured to emit radiation being optically coupled via a surface area of the semiconductor substrate, and wherein the device configured to emit radiation emits radiation upon electrostatic discharge current beginning to flow through a pin electrically coupled to the ESD device, and upon occurrence of electrostatic discharge the ESD device receives the emitted radiation to accelerate avalanche breakdown in the ESD device.

15. The integrated circuit of claim 14, wherein the device configured to emit radiation is formed within a wiring area above the semiconductor substrate.

16. The integrated circuit of claim 15, wherein the device configured to emit radiation is formed of polysilicon.

17. The integrated circuit of claim 14, wherein the device configured to emit radiation is formed within a semiconductor substrate other than the semiconductor substrate including the ESD device.

18. The integrated circuit of claim 14, wherein a series connection of the device configured to emit radiation and at least one further circuit element is connected in parallel to the ESD device.

19. The integrated circuit of claim 18, wherein the at least one further circuit element includes a Zener diode.

20. The integrated circuit of claim 14, wherein the device configured to emit radiation is a Zener diode, an anode of the Zener diode and an anode of the pn-junction of the ESD device being electrically coupled to a same circuit pin.

21. The integrated circuit of claim 14, wherein the device configured to emit radiation is a diode, a cathode of the diode and an anode of the pn-junction of the ESD device being electrically coupled to a same circuit pin.

* * * * *